(12) United States Patent
Miura et al.

(10) Patent No.: US 6,521,825 B2
(45) Date of Patent: Feb. 18, 2003

(54) BACKSIDE COVERING MATERIAL FOR A SOLAR CELL MODULE AND ITS USE

(75) Inventors: Teruo Miura, Tokyo (JP); Kazuyoshi Akuzawa, Tokyo (JP); Yasuhiro Morimura, Tokyo (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 10/073,369

(22) Filed: Feb. 11, 2002

(65) Prior Publication Data

US 2002/0129848 A1 Sep. 19, 2002

Related U.S. Application Data

(63) Continuation of application No. PCT/JP01/04832, filed on Jun. 8, 2001.

(30) Foreign Application Priority Data

| Jul. 3, 2000 | (JP) | ........................................ 2000-201201 |
| Jul. 3, 2000 | (JP) | ........................................ 2000-201202 |

(51) Int. Cl.[7] .............................................. H01L 31/02
(52) U.S. Cl. ........................ 136/251; 136/256; 136/244; 428/213; 428/214; 428/216; 428/421; 428/422; 428/426; 428/430; 428/702; 428/435; 428/474.4; 428/500
(58) Field of Search ................................. 136/251, 256, 136/244; 428/213, 214, 216, 421, 422, 426, 430, 702, 435, 474.4, 500

(56) References Cited

U.S. PATENT DOCUMENTS

| 6,335,479 B1 | * | 1/2002 | Yamada et al. | ............. | 136/251 |
| 6,369,316 B1 | * | 4/2002 | Plessing et al. | ............. | 136/251 |
| 6,407,329 B1 | * | 6/2002 | Iino et al. | .................... | 136/251 |
| 6,441,299 B2 | * | 8/2002 | Otani et al. | .................. | 136/251 |

FOREIGN PATENT DOCUMENTS

| EP | 0 631 328 | 12/1994 |
| EP | 1 150 357 | 1/1999 |
| JP | 60-201652 A | * 10/1985 |
| JP | 10-25357 A | * 1/1998 |
| WO | WO 00/35025 A1 | * 6/2000 |
| WO | 00/62348 | 10/2000 |
| WO | WO 00/62348 A1 | * 10/2000 |

OTHER PUBLICATIONS

Patent Abstracts of Japan, vol. 2000, No. 07, Sep. 29, 2000 for JP2000–114565 (Dainippon Printing Co., Ltd.) Apr. 21, 2000.

Patent Abstracts of Japan, vol. 010, No. 046, (e–383), Feb. 22, 1986, for Jp 60–201652 (Toppan Insatsu KK), Oct. 12, 1985.

Patent Abstracts of Japan, vol. 1999, No. 02, Feb. 26, 1999 for JP10–308521 (Mitsubishi Chem Corp), Nov. 17, 1998.

Patent Abstracts of Japan, vol. 1995, No. 02, Mar. 31, 1995 for JP 06–318728, (Canon Inc), Nov. 15, 1994.

* cited by examiner

*Primary Examiner*—Alan Diamond
(74) *Attorney, Agent, or Firm*—Kanesaka & Takeuchi

(57) ABSTRACT

The present invention provides a light and thin backside covering material for a solar cell module which is excellent in moisture resistance and durability and has a good insulator without causing a short circuit with underlying wire nor leak current. Also the invention provides a durable and high performance solar cell module using this backside covering material as a rear surface protection member. The backside covering material for a solar cell module is a three-layer laminated film, wherein a moisture resistant film is sandwiched with two films having heat resistance and weather resistance. A deposited layer 5 of inorganic oxide is formed on a surface of a base film 4 to make the moisture resistant film 3.

12 Claims, 3 Drawing Sheets

BACKSIDE COVERING MATERIAL FOR A SOLAR CELL MODULE AND ITS USE

CROSS REFERENCE TO RELATED APPLICATION

This is a continuation application of PCT/JP01/04832 filed on Jun. 8, 2001.

FIELD OF THE INVENTION

The present invention relates to a backside covering material used for a rear surface protection member of a solar cell module and a solar cell module using said material. Particularly, it relates to the backside covering material for a solar cell module having excellent moisture resistance and durability and insulating very well to prevent leak current, and to a durable and high-performance solar cell module using the material as the rear surface protection member.

BACKGROUND OF THE INVENTION

A solar cell module has been paid attention as a device directly converting solar energy into electric energy from the aspects of effective use of natural resources and ecology, and various solar cell modules have been developed.

As shown in FIG. 3, in a solar cell module, solar cells 14 (photovoltaic element made of silicon etc.) are sealed by ethylene-vinyl acetate copolymer (EVA) films 13A, 13B in between a transparent front surface (light receiving face) protection member 11 and a rear surface protection member (backside covering material) 12.

A solar cell module 10 is produced by the following procedures. First, a front surface protection member 11 made of glass or the like, EVA film 13A for sealant, silicon photovoltaic element 14, EVA film 13B for sealant, and a backside covering material 12 are stacked up in this sequence. Then, EVA is melted by heat and cross-linked to unify the whole solar cell module.

A backside covering material is desired to be light and thin to make a solar cell module light and thin. The backside covering material is also desired to have durability in a long term since a solar cell module is usually installed outside. Further, the backside covering material needs to have high moisture resistance to prevent permeation of moisture and water causing rusting in underlying parts such as photovoltaic element, wire, and electrodes.

The conventional backside covering material is a laminated film comprising metal foil such as aluminum foil and galvanized iron foil as a moisture preventing layer put between two resin film layers.

However, there are several disadvantages associated with the conventional backside covering material using metal foil. First, a solar cell module using the conventional material sometimes has leak current. Second, projections of underlying parts such as a photovoltaic element and a wire may penetrate through a resin film to cause a short-circuit with metal foil. Third, a laminated resin film without including metal foil cannot give enough moisture resistance.

SUMMARY OF THE INVENTION

An object of this invention is to provide a backside covering material for a rear surface protection member of a solar cell module which doesn't have any disadvantages mentioned above, is light and thin, has improved moisture resistance and durability, and also is a good insulator. Another object of this invention is to provide a solar cell module with high durability and performance using the backside covering material for a rear surface protection member.

The backside covering material for a solar cell module in this invention includes a moisture resistant film disposed between two films having heat resistance and weather resistance, wherein the moisture resistant film has a deposited layer of inorganic oxide on a surface of a base film.

The backside covering material of this invention is light and thin. The moisture resistant film having the base film and the deposited layer of inorganic oxide on the surface of the base film is highly moisture resistant and is an excellent insulator so that a short-circuit and leak current associated with underlying parts such as a photovoltaic element and a wire of a solar cell module is prevented.

Inorganic oxide used for the deposited layer of the moisture resistant film is preferably silicon oxide, most preferably SiOx, where x is in a range of 1.7–1.9. The thickness of the deposited layer is preferably in a range of 100–500 Å.

An anchor coat layer may be formed between the base film and the deposited layer of inorganic oxide. The anchor coat layer ensures the prevention of moisture permeating through the backside covering material of a solar cell module for a long time. The anchor coat layer may be of acrylic urethane resin.

The backside covering material of a solar cell module of this invention may also have an adhesive layer on one surface thereof.

The backside covering material of a solar cell module of this invention may have moisture permeability not higher than 1.0 g/m$^2$/day.

In this invention, it is preferred to use hydrogenated polybutadiene-denatured urethane adhesive to bond the film having heat resistance and weather resistance and the moisture resistant film.

A solar cell module of this invention includes at least one solar cell, a front surface protection member and a rear surface protection member. The solar cell(s) is disposed between the front surface protection member and the rear surface protection member, and the solar cell(s) is sealed by the protection members. The rear surface protection member is made of the backside covering material of this invention.

DETAILED DESCRIPTION OF THE PREFERRED EMBODIMENTS

Preferred embodiments of this invention will be described in detail with reference to drawings. The drawings represent just embodiments of the invention, and the invention is not limited to those drawings.

Figure 1:
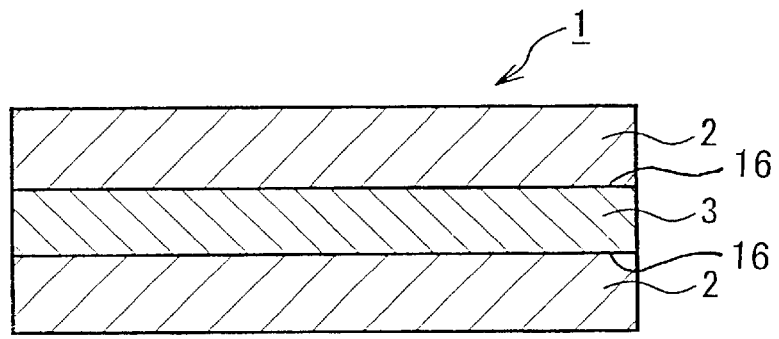
FIG. 1 is a cross-sectional view of an embodiment of this invention relating to a backside covering material for a solar cell module.
Figure 2A:
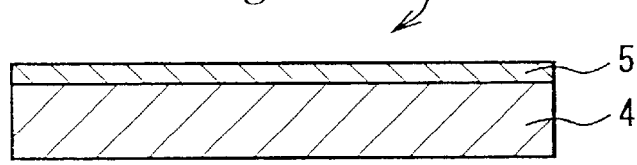
FIG. 2a is a cross-sectional view of a moisture resistant film.

FIG. 1 is a cross-sectional view of a backside covering material for a solar cell module according to an embodiment of this invention and FIG. 2a is a cross-sectional view of a moisture resistant film of the backside covering material.

A backside covering material 1 in FIG. 1 is a laminated film including a moisture resistant film 3 disposed between two films 2, 2 having heat resistance and weather resistance. The films 2, 2, 3 are made integral to form the backside covering material 1.

The moisture resistant film 3 has, as shown in FIG. 2a, a base film 4 and a deposited layer 5 which is formed by depositing inorganic oxide on a surface of the base film by one of thin layer forming processes, for example, CVD (chemical vapor deposition) method, PVD (physical vapor deposition) method, and the like.

The deposited layer 5 of inorganic oxide works as a moisture resistance layer. The inorganic oxide is preferably aluminum oxide or silicon oxide. Silicon oxide is suitable because of its durability under hot and humid condition. A thickness of this deposited layer is preferably in a range of 100–500 Å, most preferably 200–400 Å. It is preferable to use silicon oxide SiOx, where x is in a range of 1.7–1.9, for the moisture resistance layer.

The base film 4 is required to endure heat and pressure during the manufacturing process of the solar cell module. The base film 4 can be made of fluororesin such as polytetrafluoroethylene (PTFE), 4-fluoroethylene-perchloroalkoxy copolymer (PFA), 4-fluoroethylene-6-fluoropropylene copolymer (FEP), 2-ethylene-4-fluoroethylene copolymer (ETFE), poly3-chlorofluoroethylene (PCTFE), polyvinylidene fluoride (PVDF), and polyvinyl fluoride (PVF), polyester resin such as polyethylene terephthalate (PET), and other various resins such as. polycarbonate, polymethyl methacrylate (PMMA), and polyamide. The base film may include two or more kinds of resins selected from those resins listed above, and may be a multi-layer film. If necessary, additives such as a pigment, an ultraviolet light absorber and so on may be added to the base film through permeation or coating or mixing. The thickness of the base film 4 is preferably in a range from 3 to 300 $\mu$m, most preferably from 5 to 200 $\mu$m.

Figure 2B:
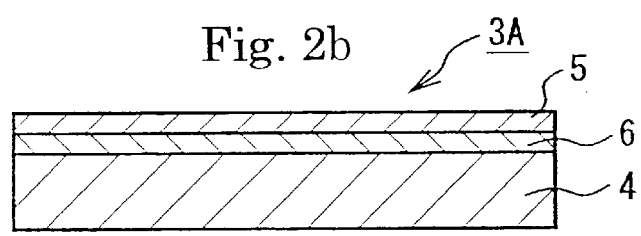
FIG. 2b is a cross-sectional view of a moisture resistant film.

As shown in FIG. 2b, an anchor coat layer 6 may be formed between the base film 4 and the deposited layer 5 of inorganic oxide to prevent moisture permeation for a long time. The anchor coat layer 6 ensures the long-term close adhesion between the deposited layer 5 and the base film 4, which allows an excellent moisture resistance of the moisture resistant film 3A.

The anchor coat layer 6 can be formed of acrylic resin, polyester resin, alkyd resin, urethane alkyd resin, polyamide resin, polyurethane resin, phenolic resin or the like. Among them, acrylic resin is preferable.

Examples of acrylic resin used for the anchor coat layer 6 include copolymer resins from esters (methyl methacrylate, butyl methacrylate, butyl acrylate, 2-hydroxyethyl acrylate, and the like) and comonomers (acrylic ester, acrylic acid, methacrylic acid and the like). When acrylic urethane resin is used for the anchor coat layer 6, the moisture resistant film is considerably improved in preventing moisture permeation. Such acrylic urethane resin is prepared by introducing functional groups (carboxyl group, hydroxyl group, methylol group, glycidyl group, and the like) to side chains of those copolymers followed by cross-linking with aliphatic isocyanate, for example, tetramethylene diisocyanate, trimethylhexamethylene diisocyanate, and the like, or aromatic isocyanate, for example, tolylene diisocyanate (TDI), diphenylmethane diisocyanate (MDI), polymeric diphenylmethane diisocyanate (P-MDI), naphthalene diisocyanate (NDI), and the like.

The anchor coat layer 6 can be formed by painting the application liquid on the base film and drying up. The application liquid is desirable to be an aqueous solution.

A thickness of the anchor coat layer 6 is preferably in a range from 0.01 to 1 $\mu$m.

Prior to form the anchor coat layer 6 the surface of the base film 4 may be processed by the corona treatment to improve close adhesion between the layer 6 and the film 4.

The moisture resistant film having improved moisture resistance and close adhesion with the deposited layer can be obtained by curing for more than 24 hours at 40–80° C. after deposition of inorganic oxide onto the base film.

The backside covering material 1 of a solar cell module has a laminated three-layer structure. A middle layer is the moisture resistant film 3 or 3A disposed between two films 2, 2 having heat resistance and weather resistance.

The film 2 having heat resistance and weather resistance is required to endure heat and pressure during the manufacturing process of the solar cell w module like the base film. Materials of the film 2 can be the same materials with that of the base film mentioned above. Also, similar to the base film, the film 2 having heat resistance and weather resistance can be made of two or more kinds of resins. The film 2 can be a composite laminating two or more films. If necessary, additives such as a pigment, an ultraviolet light absorber, a coupling agent and so on may be added to materials of the film having heat resistance and weather resistance through permeation or coating or mixing. A thickness of the film 2 is preferably in a range from 5 to 200 $\mu$m.

A color of the film 2 having heat resistance and weather resistance is not particularly specified. While white color and the like is appropriate for improving efficiency of generating electricity, black and other dark colors are appropriate for a nice appearance when a solar cell module is installed at houses.

Two films 2, 2 having heat resistance and weather resistance with the moisture resistant film between them are not necessarily made of the same materials.

With respect to two films having heat resistance and weather resistance, one of the two films placed on an outer side of a solar cell-module is preferred to be made of fluororesin because of its high weather resistance, and the other film placed on an inner side of the solar cell module is preferred to be made of materials including a pigment and so on, that is, materials having reflectivity.

A method of manufacturing the backside covering material of this invention may include the steps of: applying an adhesive 16 between the film 2 having heat resistance and weather resistance and the moisture resistant film 3; and bonding the films by the dry lamination method or the heat press method to form a composite.

The adhesive 16 can be one of ordinary polyester or polyether adhesives. However, a polyester adhesive has low initial adhesion and sometimes has insufficient heat resistance. A polyester adhesive having high heat resistance sometimes has low heat-and-moisture resistance. These are caused by the fact that those adhesives have the chemical structure —O— or —C=O—O— in their main chains.

To overcome these disadvantages, a hydrogenated polybutadiene denatured urethane adhesive may be used to bond films 2, 2 and the moisture resistant film. The main chain of this adhesive is a butadiene structure and, further, the main chain is hydrogenated to prevent the degradation caused by breakage of double bonds. Because of the main chain constructed by the chemical structure —$CH_2$—, this adhesive shows a considerably improved durability in adhesion compared to conventional adhesives.

The backside covering material for a solar cell module may be unified with EVA film used as a sealant through the lamination. A thickness of EVA film is preferably in a range of 0.1–1 mm.

Figure 6:
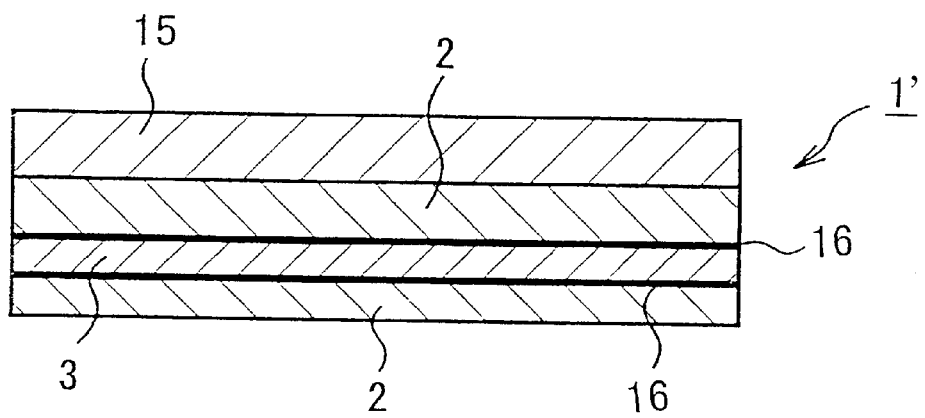
FIG. 6 is a cross-sectional view of an embodiment of a backside covering material working also as a sealant for a solar cell module.

FIG. 6 is a cross-sectional view of a backside covering material for a solar cell module unified with a sealant.

The backside covering material unified with the sealant 1' for a solar cell module comprises two films having heat resistance and weather resistance 2, 2, the moisture resistant film 3 put in between two films 2, 2, and further, an adhesive layer 15 disposed adjacent to an outer surface of one of films 2, 2.

In the back side coveting material unified with the sealant 1', the films having heat resistance and weather resistance are formed to protect the moisture resistant film 3 and to improve working efficiency in manufacturing solar cell modules. These films are also required to endure heat and pressure through manufacturing process of a solar cell module. Since one of these two films 2 placed on the opposite side of the adhesion layer 15 becomes an outermost layer of a solar cell module once assembled, the film 2 is required to withstand degradation in field use for an extended period of time.

The adhesion layer 15 works as a sealant of underlying parts such as photovoltaic element and other members and also as a cushioning material. That is, the adhesion layer is required to have good adhesion by the heat to bond and unify a transparent front surface protection member made of glass or the like, a conducting film made of metallic oxide such as ITO, and a silicon photovoltaic element. EVA resin, PVB resin or the like is usually used for the adhesion layer. Adhesive resins such as silicon resin, acrylic resin, butyl resin, and epoxy resin, can also be used for the adhesion layer. EVA adhesive resin is mostly used because of its handling efficiency and low cost. EVA resin composition used for this EVA adhesive resin will be detailed later.

A thickness of the adhesion layer 15 is preferably in a range of 0.1–1 mm.

A solar cell module of this invention is composed of laminated layers including the backside covering material 1 (or 1'), EVA sealing film 13B, at least one solar cell 14 made of silicon photovoltaic element or the like, EVA sealing film 13A, and the front surface protection member 11 made of glass or high-functioning laminated film. It is desirable that those layers are bonded by a vacuum laminator operating under the following heating and pressing condition: temperature 120–150° C.; deaeration time for 2–15 min; pressure 0.5–1 atm; and pressing time for 8–45 min.

In order to improve weather resistance it is preferred to add a cross-linking agent into EVA resin composition. The cross-linking agent is preferably chosen from organic peroxides generating radicals above 100° C., most preferably from organic peroxides having a half-life of 10 hours and a decomposition temperature above 70° C. Examples of those organic peroxides include 2,5-dimethylhexane; 2,5-dihydroperoxide, 2,5-dimethyl-2,5-di(tert-butylperoxy) hexane, 3-di-tert-butylperoxide, tert-dicumyl peroxide, 2,5-dimethyl-2,5-di(tert-butyl-peroxy)hexyne, dicumyl peroxide, α, α'-bis(tert-butylperoxyisopropyl)benzene, n-butyl-4,4-bis(tert-butyl-peroxy)butane, 2,2-bis(tert-butylperoxy)butane, 1,1-bis(tert-butylperoxy)cyclohexane, 1,1-bis(tert-butylperoxy)-3,3,5-trimethylcyclohexane, tert-butyl peroxybenzoate, and benzoyl peroxide. The amount of organic peroxide is preferably 5 parts by weight or less, most preferably 1–3 parts by weight, for 100 parts by weight of EVA resin composition.

A coupling agent made of silane compounds may be added into EVA resin composition to improve adhesion of EVA resin. Examples of silane coupling agent include γ-chloropropyltrimethoxysilane, vinyltrichlorosilane, vinyltriethoxysilane, vinyl-tris-(γ-methoxyethoxy)silane, γ-methacryloxypropyltrimethoxysilane, β-(3,4-ethoxycyclohexyl)ethyltrimethoxysilane, γ-glycidoxypropyltrimethoxysilane, vinyltriacetoxysilane, γ-mercaptopropyltrimethoxysilane, γ-aminopropyltrimethoxysilane, and N-β-(aminoethyl)-γ-aminopropyltrimethoxysilane. The amount of the silane coupling agent is preferably 5 parts by weight or less, most preferably 0.1–2 parts by weight, for 100 parts by weight of EVA resin composition.

A crosslinker may be added into EVA resin composition to increase gel fraction of EVA resin, that is, to improve durability of EVA resin. The crosslinker can be a crosslinker having 3 functional groups such as triallyl isocyanurate and triallyl isocyanate, or having only one functional group such as NK ester. The amount of the crosslinker is preferably 10 parts by weight or less, most preferably 1–5 parts by weight, for 100 parts by weight of EVA resin composition.

EVA resin composition may include compound(s) such as hydroquinone, hydroquinone monomethyl ether, p-benzoquinone, and/or methylhydroquinone to improve the stability of EVA resin. The amount of such compound(s) is 5 parts by weight or less for 100 parts by weight of EVA resin composition.

Other additives, for example, colorant, ultraviolet light absorber, anti-aging agent, and discoloring inhibitor may be added into EVA resin composition. The colorant may be an inorganic pigment (metallic oxide, metallic power, and the like) or an organic pigment (azo group, phthalocyanine group, azine group, acid lake, basic lake, or the like). Examples of the ultraviolet light absorber include benzophenone such as 2-hydroxy-4-octoxybenzophenone and 2-hydroxy-4-methoxy-5-sulfobenzophenone, benzotriazole such as 2-(2'-hydroxy-5-methylphenyl)benzotriazole, and salicylate such as phenylsucylate, p-t-butylphenyl sulicylate. With respect to an anti-aging agent, amine compounds, phenol compounds, bisphenyl compounds, and hindered amine compounds, for example, di-t-butyl-p-cresol and bis (2,2,6,6-tetramethyl-4-piperazyl)sebacate are used.

Besides EVA resin, PVB resin, silicon resin, acrylic resin, butyl resin, and epoxy resin can be used for sealing films 13A, 13B of this invention.

Figure 3:
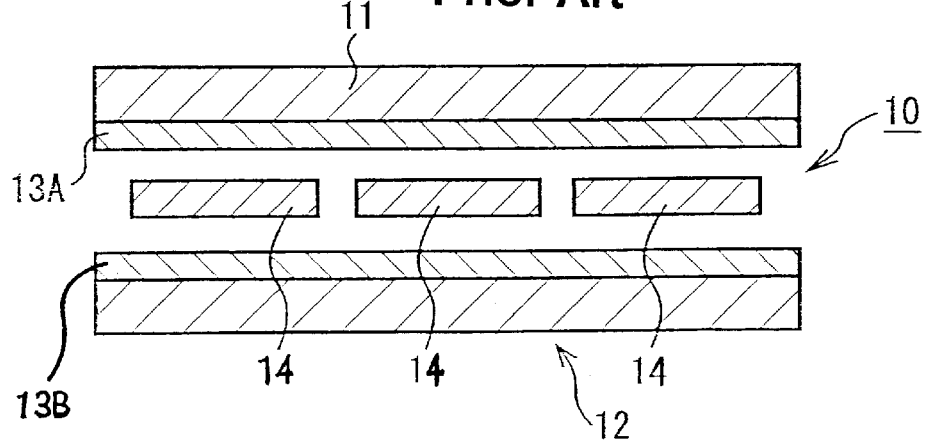
FIG. 3 is a cross-sectional view of a conventional solar cell module.
Figure 4:
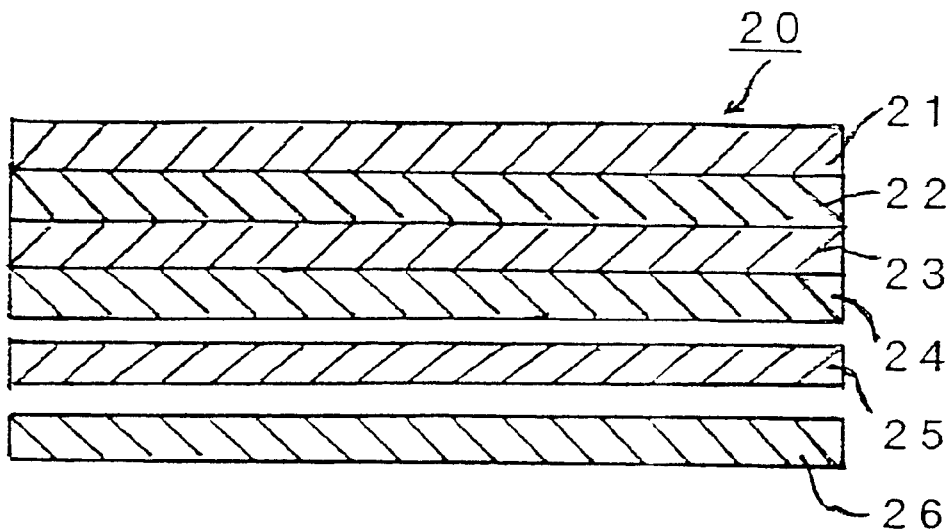
FIG. 4 is a cross-sectional view of an embodiment of a solar cell module using the backside covering material of this invention.
Figure 5:
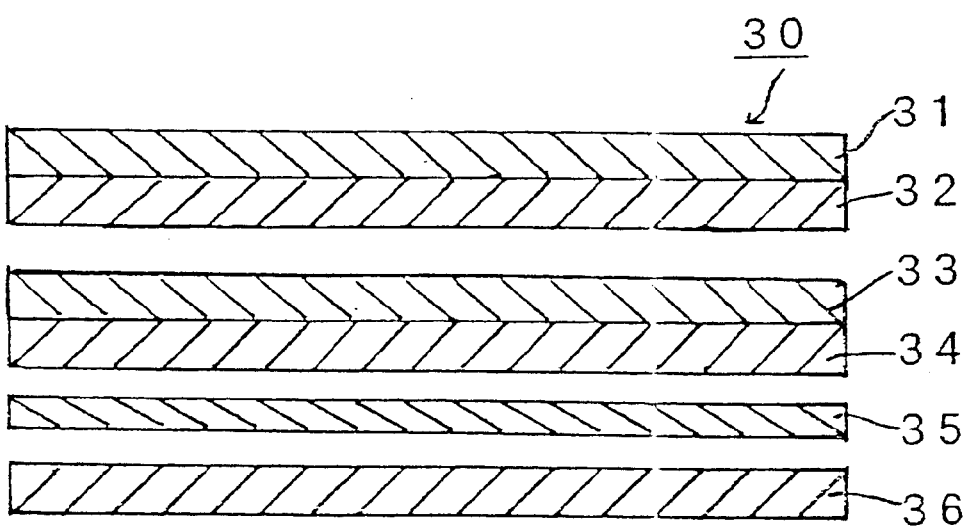
FIG. 5 is a cross-sectional view of another embodiment of a solar cell module using the backside covering material of this invention.

The backside covering material of this invention is applied to a bulk solar cell module (FIG. 3) using single crystal or polycrystal of silicon. Also, the backside covering material can be applied to a thin film solar cell module 20 using silicon film, II–VI compound (CdTe), chalcopyrite thin film (CIS), or organic semiconductor without making any changes in the material's structure as shown in FIG. 4, where a glass 21, a transparent electrode 22, a thin film semiconductor 23, a metallic electrode 24, a sealant 25, and a back covering material 26 are shown. Further, the backside covering material can be applied to a flexible type of a thin film solar cell module, in which a front surface protection member is made of a transparent resin film instead of glass, as shown in FIG. 5, where a transparent resin film 31, a sealant 32, a thin film solar cell element 33, a base film 34, a sealant 35, and a backside covering material 36 are shown.

Hereinafter, the present invention will be described in detail with reference to examples and comparative examples.

EXAMPLES 1 AND 2

One of two films having heat resistance and weather resistance was made of polyester film mixed with a white pigment (U2, manufactured by Teijin-Du Pont Film, Co. Ltd., thickness: 38 μm) and the other film was made of ETFE film (AFFLEX manufactured by Asahi Glass Co. Ltd., thickness: 21 μm). After placing a moisture resistant film having a composition in Table 1 in between two films described above, those three films were bonded to make a backside covering material of this invention. The bonding was done through an ordinary dry lamination method at temperature 60–90° C. with 3 kg of nip pressure using an acrylic urethane adhesive applied with 10 μm of thickness.

The endurance test has been made to the backside covering materials made by the method described above, in which the materials were let stand for 1000 hours under a more harsh condition, at 85° C. with 90%RH, than an ordinary endurance test condition, at 65° C. with 95%RH. After the endurance test, the moisture permeability of the materials was measured by the MOCON method (at 40° C., 90%RH). The results are listed in Table 1.

Comparative Example 1

A laminated film was formed by the same manner with Example 1, in which a middle layer of a transparent PET film (S-PET manufactured by Teijin-Du Pont Film, Co. Ltd., thickness: 50 μm) was sandwiched with two white PVF films (TEDLER manufactured by Du Pont, Co. Ltd., thickness: 38 μm).

The film was tested by the same test with that in Example 1. The result is given in Table 1.

EXAMPLE 3

One of two films having heat resistance and weather resistance was made of polyester film mixed with a white pigment (U2 manufactured by Teijin-Du Pont Film, Co. Ltd., thickness: 38 μm) and the other film was made of ETFE film (AFFLEX manufactured by Asahi Glass, Co. Ltd., thickness: 21 μm). A moisture resistant film was made by depositing SiOx (x=1.8) on a surface of PET film with 12 μm of thickness to form a moisture resistance layer with 200 Å of thickness. The moisture resistant film was placed in between two films having heat resistance and weather resistance. These three films were bonded with an adhesive given in Table 2. Further EVA adhesive layer with 50 μm of thickness was formed on the outer surface of the polyester film to make a backside covering material working also as a sealant of this invention.

The endurance test has been made to the obtained backside covering material unified with the sealant, in which the material was let stand for 1000 hours under a more harsh condition, at 85° C. with 90%RH, than an ordinary endurance test condition, at 65° C. with 95%RH. After the endurance test, moisture permeability of the material was measured by the MOCON method (at 40° C., 90%RH). Also, adhesion of the material was measured before and after the endurance test by the T-type adhesion test method. The results are given in Table 2.

Comparative Example 2

A laminated film consisting of a transparent PET film (S-PET manufactured by Teijin-Du Pont Film, Co. Ltd., thickness: 50 μm) sandwiched with two white PVF films (TEDLER manufactured by Du Pont, Co. Ltd., thickness: 38 μm) was made in the same manner with Example 1. Moisture permeability and adhesion of the film were measured in the same manner with Example 3. The results are given in Table 2.

Comparative Examples 3 and 4

A backside covering material unified with a sealant was formed in the same manner with Example 3 except for using an adhesive given in Table 2 to bond films having heat resistance and weather resistance and the moisture resistant

TABLE 1

|  |  | Examples | | Comparative Example |
|---|---|---|---|---|
|  |  | 1 | 2 | 1 |
| Composition of moisture resistant film | Base film (Thickness) | PET film (12 μm) | PET film (12 μm) | PVF/PET/PVF (38 μm/50 μm/38 μm) |
|  | Presence of anchor coat layer | No | Yes |  |
|  | Resin of anchor coat layer (Thickness) | — | Acrylic urethane resin(0.1 μm) |  |
|  | Compound used for deposited layer (Thickness) | Silicon oxide (200 Å) | Silicon oxide (200 Å) |  |
| Moisture permeability (g/m²/day) |  | 3.7 | 0.2 | 5.5 |

As a result from Table 1, it has been found that the backside covering material of this invention is excellent in preventing moisture permeation and in durability.

film. Moisture permeability and adhesion of the films were measured in the same manner with Example 3. The results are given in Table 2.

TABLE 2

| Example | Moisture resistant film | Adhesive | Moisture permeability (g/m²/day) | Adhesion (gf/25 mm) Before endurance test | Adhesion (gf/25 mm) After endurance test |
|---|---|---|---|---|---|
| Example 3 | SiOx deposited layer | Hydrogenated polybutadiene denatured urethane | 0.3 | 2100 | 1500 |
| Comparative Example 2 | PVF/PET/PVF | Polyurethane | 5.5 | 2000 | 150 |
| Comparative Example 3 | SiOx deposited layer | Polyether | 1.5 | 1700 | 300 |
| Comparative Example 4 | SiOx deposited layer | Polyester | 3.6 | 2400 | 100 |

As a result from Table 2, it has been found that the backside covering material unified with the sealant of this invention is excellent in preventing moisture permeation, adhesion, and durability.

As detailed above, a backside covering material for a solar cell module of this invention is light, thin, and excellent in moisture resistance and durability. Further, the material doesn't have any problems associated with a short circuit or leak current. A solar cell module using this backside covering material as its rear surface protection member is free from rust, and has an excellent moisture resistance, a long-term durability, and no lowering of performance caused by a short circuit or leak current.

What is claimed is:

1. A backside covering material used for a rear surface protection member of a solar cell module, comprising:

two heat and weather resistant films, and a moisture resistant film deposited between the two heat and weather resistant films and formed of a base film, an anchor coat layer made of acrylic urethane resin and deposited on the base film, and a deposited layer of inorganic oxide containing silicon oxide on a surface of the anchor coat layer.

2. A backside covering material for a solar cell module as claimed in claim 1, wherein said silicon oxide is SiOx, where x is in a range of 1.7–1.9.

3. A backside covering material for a solar cell module as claimed in claim 1, wherein a thickness of the anchor coat layer is in a range of 0.01–1 μm.

4. A backside covering material for a solar cell module as claimed in claim 1, wherein a thickness of said deposited layer of the inorganic oxide is in a range of 100–500 Å.

5. A backside covering material for a solar cell module as claimed in claim 1, wherein said base film includes at least one film made of a substance selected from the group consisting of fluororesin, polyester, polycarbonate, polymethylmethacrylate, and polyamide.

6. A backside covering material for a solar cell module as claimed in claim 1, wherein a thickness of the base film is in a range of 3–300 μm.

7. A backside covering material for a solar cell module as claimed in claim 1, wherein at least one of said heat and weather resistant films, and the moisture resistant film are bonded with a hydrogenated polybutadiene denatured urethane adhesive.

8. A backside covering material for a solar cell module as claimed in claim 1, wherein an adhesive layer is disposed adjacent to one surface of said backside covering material.

9. A backside covering material for a solar cell module as claimed in claim 8, wherein the adhesive layer is made of EVA resin, PVB resin, silicone resin, acrylic resin, butyl resin, or epoxy resin.

10. A backside covering material for a solar cell module as claimed in claim 1, wherein moisture permeability of said backside covering material is 1.0 g/m²/day or less.

11. A solar cell module comprising:

at least one solar cell; and a front surface protection member and a rear surface protection member with said at least one solar cell therebetween, said rear surface protection member being the backside covering material for a solar cell module as claimed in claim 1.

12. A backside covering material for a solar cell module as claimed in claim 1, wherein said backside covering material consists essentially of said two heat and weather resistant films, and said moisture resistant film formed of said base film, said anchor coat layer and said deposited layer of inorganic oxide.

* * * * *